United States Patent [19]

Zaborowski

[11] 4,410,880
[45] Oct. 18, 1983

[54] DIGITAL-TO-ANALOG CONVERTER AND ANALOG-TO-DIGITAL CONVERTER WITH CONTROLLABLE BI-POLAR AND UNI-POLAR CAPABILITY

[75] Inventor: Roy A. Zaborowski, Phoenix, Ariz.

[73] Assignee: Sperry Corporation, New York, N.Y.

[21] Appl. No.: 247,448

[22] Filed: Mar. 25, 1981

[51] Int. Cl.³ ............................................ H03K 13/02
[52] U.S. Cl. ........................ 340/347 DA; 340/347 M
[58] Field of Search ... 340/347 M, 347 AD, 347 DA, 340/347 CC

[56] References Cited

U.S. PATENT DOCUMENTS 3,755,807 8/1973 Brown ...................... 340/347 M X

OTHER PUBLICATIONS

Beckman Technical Bulletin, Series 7521M, CMOS, 12-Bit Multiplying D/A Converter, 10/77, 4 pages.
The Engineering Staff of Analog Devices, Inc., Analog-Digital Conversion Handbook, 6/72, pp. II-46 to II-48; II-80 and II-81.
Sklar, 2's Complement Arithmetic Operations, Computer Design, vol. 11, No. 5, 5/72, pp. 115-121.
The Engineering Staff of Analog Devices, Inc., Analog-Digital Conversion Handbook, 6/72, pp. II-16 to II-30 inclusive.

*Primary Examiner*—T. J. Sloyan
*Attorney, Agent, or Firm*—Howard P. Terry; Albert B. Cooper

[57] ABSTRACT

The digital-to-analog converter comprises an R–2R ladder network with bit controlled current steering switches connecting the legs of the ladder network to first and second current buses. First and second current-to-voltage converters are connected to the current buses respectively, the second current-to-voltage converter being connected through a switch to the input of the first current-to-voltage converter. A uni-polar/bi-polar control signal renders the switch conductive or non-conductive in accordance with the data format desired. The digital-to-analog converter is also utilized in a successive approximation analog-to-digital converter.

1 Claim, 2 Drawing Figures

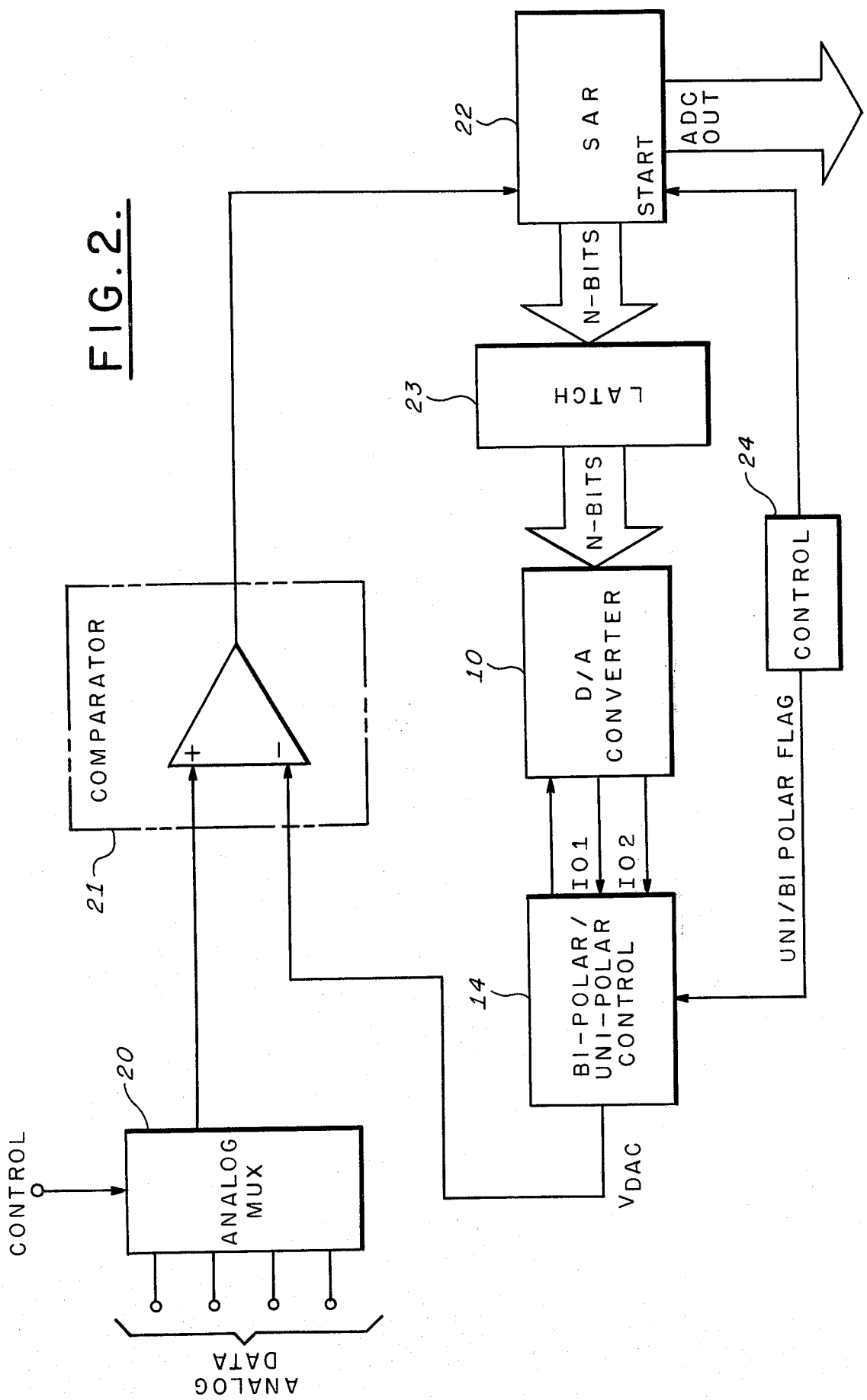

DIGITAL-TO-ANALOG CONVERTER AND ANALOG-TO-DIGITAL CONVERTER WITH CONTROLLABLE BI-POLAR AND UNI-POLAR CAPABILITY

BACKGROUND OF THE INVENTION

1. Field of the Invention

The invention relates generally to digital-to-analog converters and analog-to-digital converters specifically with respect to a digital-to-analog converter providing bi-polar and uni-polar output formats utilizing a single converter.

2. Description of the Prior Art

Present day digital data handling systems of the type, for example, utilized for aircraft control and data management require analog-to-digital conversion at the input to the system for converting analog data signals to the digital format required by the system and digital-to-analog conversion at the output of the system to convert the digital numbers provided by the system into the analog signals required by utilization devices. The analog signals provided to such systems and the analog signals required by the utilization devices generally have both uni-polar and bi-polar formats. A uni-polar signal varies between zero volts and a maximum positive voltage or between zero and a maximum negative voltage. A bi-polar signal varies between a maximum negative voltage and a maximum positive voltage generally with zero voltage at the center of the range. Examples of uni-polar signals encountered in aircraft data handling systems are altitude that varies from zero feet to a positive maximum altitude and airspeed that varies from zero knots to a positive maximum airspeed. Examples of bi-polar signals are altitude hold error with respect to a preselected reference altitude where the error signal varies positively and negatively according to whether the aircraft is above or below the reference value and altitude rate that can vary positively and negatively in accordance with whether the aircraft is ascending or descending.

The digital format corresponding to the uni-polar analog signal comprises a set of digital binary digits, or bits, varying from all ZEROS to all ONES, the all ZEROS number corresponding to the zero end of the uni-polar range and the all ONES corresponding to the maximum voltage end of the uni-polar range. The digital bi-polar format comprises a set of bits which range from all ZEROS to all ONES where all ZEROS correspond to one end of the bi-polar analog range and all ONES to the other end of the analog bi-polar range. The zero voltage middle of the range is typically represented by the midvalue digital number consisting of a ONE in the most significant bit position with all of the remaining bits being ZERO.

Integrated circuit digital-to-analog converters are commercially procurable and are commonly utilized in data handling systems as described above. The analog-to-digital conversion function may be performed utilizing a digital-to-analog converter and a comparator to form a conventional successive approximation converter. Such commercially procurable integrated circuit digital-to-analog converters are commonly of the R–2R ladder network variety with a plurality of current steering switches connected to the respective legs of the ladder network. Such digital-to-analog converter integrated circuits commonly provide two current bus outputs, the two poles of each current steering switch being connected to the respective current buses. The binary digits of the digital word to be converted are applied through level shifters to control the states of the respective switches. A binary ONE applied to a switch results in the binary weighted current flowing in the associated leg of the ladder network to be connected to one of the two current buses. A binary ZERO causes the switch to steer the binary weighted current to the other current bus.

Such digital-to-analog chips may be connected to operate in either a uni-polar mode or in a bi-polar mode. In the uni-polar mode a current-to-voltage converter is connected to one of the current buses with the other current bus being grounded. In bi-polar operation two current-to-voltage converters are utilized connected to the respective current buses with the output of one current-to-voltage converter being summed with the input to the other current-to-voltage converter, the output of the other current-to-voltage converter providing the bi-polar device output.

Data handling systems in which both uni-polar and bi-polar data is processed conventionally utilize separate dedicated uni-polar and bi-polar converters at the input and output. For example, such a system may utilize a uni-polar analog-to-digital converter and a bi-polar analog-to-digital converter at the input of the system with address bus control directing the various uni-polar and bi-polar analog signals to the appropriate converter. In a similar manner, the system conventionally utilizes a dedicated uni-polar digital-to-analog converter and a dedicated bi-polar digital-to-analog converter with address control directing the appropriate digital outputs to the appropriate converters.

The dual dedicated converter approach to input/output design is complex and hence expensive, requires excessive printed circuit board area and excessive power and degrades system reliability. An alternative prior art approach utilizes a single bi-polar converter to perform both uni-polar and bi-polar conversions. Bi-polar data is converted as usual, however uni-polar conversions operate over only half the converter's range. If both signal formats must be converted to the same minimum resolution (e.g., n bits) then the converter itself must have twice that resolution (n+1 bits) in order to meet the requirements for the uni-polar case. This method is unduly expensive since cost increases rapidly with converter resolution and accuracy. The prior art also suggests altering the uni-polar signal formats by means of a scaling and offset amplifier so that the full range of a bi-polar converter is utilized. This approach is subject to the disadvantages of drift, scale factor and offset errors.

SUMMARY OF THE INVENTION

The present invention utilizes a single digital-to-analog converter for either uni-polar or bi-polar data. The inventive configuration comprises a digital-to-analog converter having first and second current bus outputs with first and second current-to-voltage converters coupled thereto. The output of one current-to-voltage converter is coupled through a switch and combined with the input to the other current-to-voltage converter. A control bit associated with the data words is coupled to the switch to render the switch conductive for bi-polar operation and to render the switch non-conductive for uni-polar operation. In both uni-polar and bi-polar operation the analog output of the device is provided by the current-to-voltage converter into the input of which the output of the other current-to-voltage converter is summed. During the uni-polar operation the output of the current bus connected to the current-to-voltage converter that provides the input to the other current-to-voltage converter is maintained at virtual ground.

The present invention also contemplates utilizing the above described digital-to-analog converter in a successive approximation analog-to-digital converter with controllable uni-polar and bi-polar capability.

BRIEF DESCRIPTION OF THE DRAWINGS

FIG. 2 is a schematic block diagram of a successive approximation analog-to-digital converter utilizing the digital-to-analog converter of FIG. 1.

DESCRIPTION OF THE PREFERRED EMBODIMENT

Figure 1:
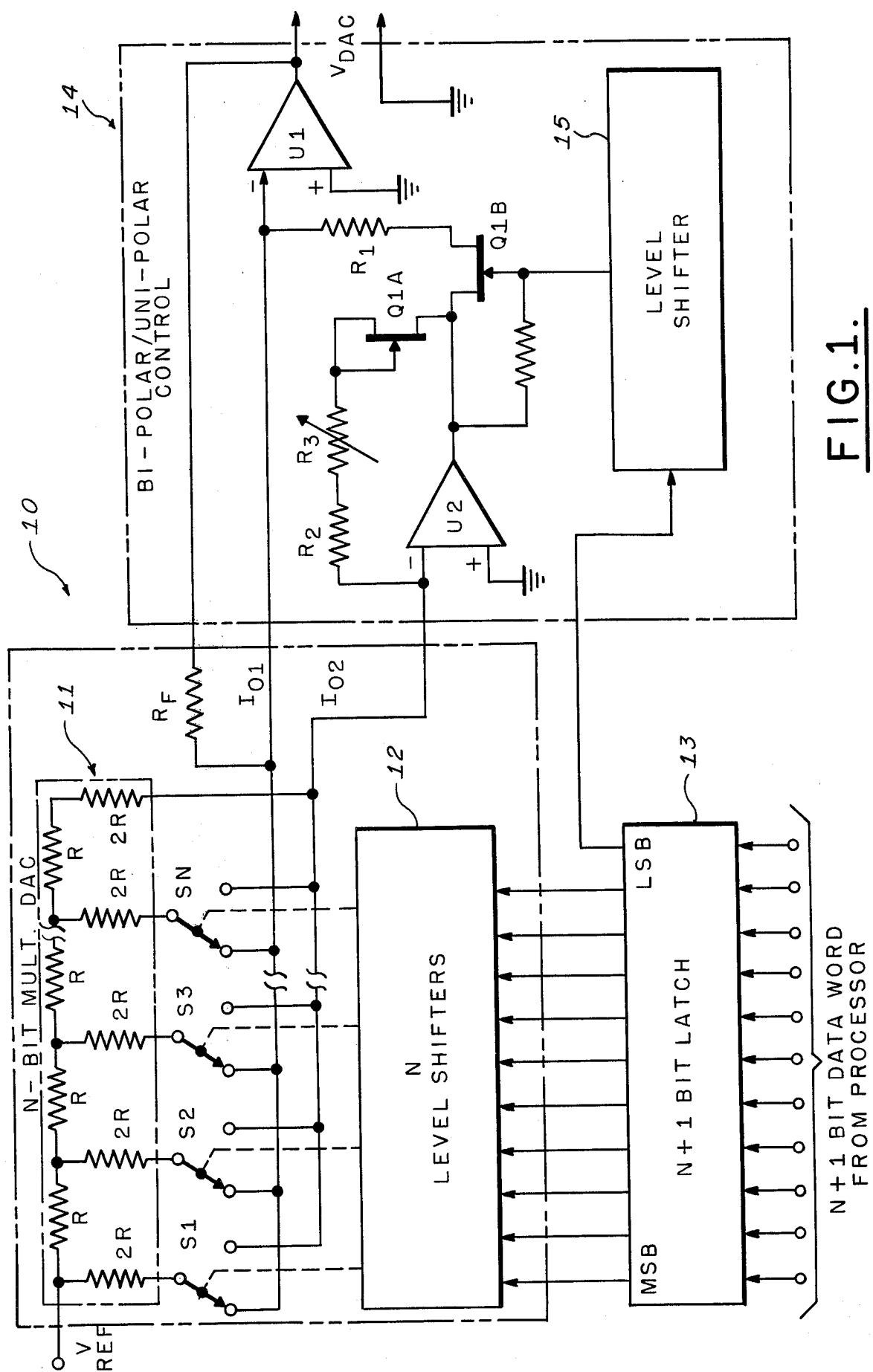
FIG. 1 is a schematic diagram partially in block format of a digital-to-analog converter configured in accordance with the present invention.

Referring to FIG. 1, a preferred embodiment of a digital-to-analog converter configured in accordance with the present invention utilizes an N-bit multiplying digital-to-analog converter 10. The converter 10 comprises a conventional R-2R ladder network 11 to which a reference voltage $V_{REF}$ is applied. The 2R legs of the ladder network 11 are connected to respective current steering switches S1 through SN. The outputs from the converter 10 are provided by first and second current buses $I_{01}$ and $I_{02}$ respectively.

A first contact of each of the current steering switches S1 through SN is connected to the $I_{01}$ current bus and the second contact of each of the switches S1 through SN is connected to the second current bus $I_{02}$. The converter 10 also includes N-level shifters 12 for providing control voltages to the switches S1 through SN respectively. The N-level shifters 12 are coupled to receive the N most significant bits from an N+1 bit latch 13 which, in turn, receives an N+1 bit data word from a suitable input device such as a microprocessor and a control bit which latches the data word. When an input data bit to the level shifter controlling one of the current steering switches S1 through SN is a binary ONE, the switch is connected to the $I_{01}$ bus and when the bit is a binary ZERO, the switch is connected to the $I_{02}$ bus. Thus it is appreciated that the switches S1 through SN steer the binary weighted currents that flow in each 2R leg of the R-2R network 11 to either the $I_{01}$ bus or the $I_{02}$ bus. By maintaining the $I_{01}$ and the $I_{02}$ buses at ground potential, the currents on the two buses are complementary and sum to the current supplied by the $V_{REF}$ input and is equal to $V_{REF}/R$. The digital-to-analog converter 10 also includes a feedback resistor $R_F$, which is matched to the R-2R network 11, to be utilized in a manner to be explained.

The $I_{01}$ bus and $I_{02}$ bus, as well as the least significant bit from the N+1 bit latch 13 are applied as inputs to a bi-polar/uni-polar control circuit 14. The $I_{01}$ current bus is connected to an operational amplifier current-to-voltage converter U1 which utilizes as its feedback resistor the $R_F$ resistor in the converter 10. The operation of U1 in this configuration maintains $I_{01}$ at ground potential. The output $V_{DAC}$ of the current-to-voltage converter U1 provides the output of the digital-to-analog converter of the present invention in either uni-polar or bi-polar format in accordance with the state of the least significant bit from the N+1 bit latch 13. This least significant bit is accordingly denoted as a uni-/bi-polar flag.

The $I_{02}$ bus is connected to the input of an operational amplifier current-to-voltage converter U2 which has as its feedback path a JFET Q1A which is biased for low drain-source channel resistance, a potentiometer $R_3$, and a resistor $R_2$. The operation of U2 in this configuration maintains $I_{02}$ at ground potential. The output of the current-to-voltage converter U2 is connected through a JFET switch Q1B and a resistor $R_1$ to be summed with the input to the current-to-voltage converter U1. It will be recognized by those skilled in this art that the discrete resistor $R_1$ may be eliminated and the inherent channel resistance of Q1B may be employed to provide the same summing function. This, of course, also applies to Q1A in which case one or both resistances $R_2$, $R_3$ may be eliminated. The uni-/bi-polar flag from the N+1 bit latch 13 is applied through a level shifter 15 to the gate of the JFET switch Q1B. The level shifter 15 translates the digital logic signal from the latch 13 to a control signal to actuate the switch Q1B. When the uni-/bi-polar flag input to the level shifter 15 is a binary ONE, the JFET switch Q1B is turned OFF. When the flag is a binary ZERO the switch is turned ON. Preferably the JFETs Q1A and Q1B comprise a dual JFET Q1 with matched channel characteristics.

In uni-polar operation the uni-/bi-polar flag from the latch 13 is a binary ONE which turns the JFET Q1B off such that the high impedance channel resistance of the JFET disconnects the current-to-voltage converter U2 from $R_1$. The current-to-voltage converter U1 then operates to convert the current on the current bus $I_{01}$ to the uni-polar output voltage $V_{DAC}$. The current-to-voltage converter U2 continues to maintain the current bus $I_{02}$ at virtual ground but the current from $I_{02}$ does not affect the output $V_{DAC}$.

In bi-polar operation the uni/bi-polar flag from the latch 13 is a binary ZERO which switches the JFET Q1B to its low impedance state connecting the current-to-voltage converter U2 to the input of the current-to-voltage converter U1. The output of U2 is summed through $R_1$ into the converter U1 to provide the bi-polar output $V_{DAC}$.

In uni-polar operation with Q1B turned off, the output of U1 is $$V_{DAC} = -I_{01} R_F$$

which is the standard uni-polar output equation. In bi-polar operation, when Q1B is turned on, the output of U1 is $$V_{DAC} = -I_{01} R_F - (-I_{02}(R_2+R_3+r_{dsQ1A}))(R_F/(R_1+r_{dsQ1B}))$$

where $r_{dsQ1B}$ is the drain-source channel resistance of Q1B when Q1B is turned on and $r_{dsQ1A}$ is the drain-source channel resistance of Q1A when Q1A is turned on. It is appreciated from the circuit arrangement that Q1A is always turned on.

By setting $$R_2+R_3+r_{dsQ1A} = R_1+r_{dsQ1B}$$

the output of U1 is $$V_{DAC} = (I_{02}-I_{01})R_F$$

which is the standard bi-polar output equation. The above delineated conditions are satisfied by setting R1=R2+R3 since the channel resistances of Q1A and Q1B are substantially equal. The potentiometer R3 is utilized to match the total equivalent resistance of R2, R3 and Q1A to that of Q1B R1. Thus it is appreciated that for bi-polar operation it is necessary that the sum of the resistances R2, R3, and Q1A equals the resistances of R1 and Q1B. By utilizing the dual integrated JFETs, Q1A which is always turned on, is identical to Q1B and closely tracks the resistance of Q1B when Q1B is turned on. As the temperature environment changes the channel resistances of Q1A and Q1B can vary significantly. By utilizing the dual integrated JFETs, the temperature coefficients are substantially identical and resistance matching is maintained throughout the temperature range of the device.

It is appreciated that for proper calibration the equivalent resistance of the R-2R ladder network 11 must be equal to $R_F$ and a conventional trimming process is utilized to achieve the equal equivalent resistances.

Referring to FIG. 2, in which like reference numerals indicate like components with respect to FIG. 1, a successive approximation analog-to-digital converter utilizing the digital-to-analog converter of FIG. 1 is illustrated. The converter of FIG. 2 utilizes an analog multiplexer 20 which receives input analog signals or either bi-polar or uni-polar signal format. The control signal to the multiplexer 20 selects one of the analog input channels and applies the input to a comparator 21. The output of the comparator 21 is applied as the logic control input to a standard successive approximation register 22. The N-bit output of the successive approximation register 22 is applied via a latch 23 to the digital-to-analog converter 10. The current outputs $I_{01}$ and $I_{02}$ of the converter 10 are applied to the bi-polar/uni-polar control circuit 14 which in turn provides the converted analog signal $V_{DAC}$ to the comparator 21. Control circuits 24 provide a uni/bi-polar flag signal to the control circuit 14 to set the circuit for either uni-polar or bi-polar operation and additionally provides a start signal to the successive approximation register 22 to commence a successive approximation analog-to-digital conversion. The uni/bi-polar flag from the control circuit 24 is approximately set in accordance with the format of the data selected by the analog multiplexer 20. In response to the start signal from the control circuit 24 the successive approximation conversion of the analog signal from the multiplexer 20 into an equivalent digital number is performed with the digital result appearing in the register 22 and applied to an output 25 thereof.

It will be appreciated that although the apparatus of FIG. 2 is conveniently described in terms of the successive approximation register 22, preferably the functions performed thereby are embodied by a microprocessor programmed to perform the successive approximation algorithm. In this preferred embodiment the output of the comparator 21 is fed to the microprocessor which performs the successive approximation algorithm in response thereto. The successive approximation register 22 in this preferred embodiment, therefore, is not utilized.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. A uni-polar/bi-polar digital-to-analog converter comprising digital-to-analog converter means having first and second current bus outputs, first and second current-to-voltage converters coupled to said first and second current bus outputs respectively, switching means coupling the output of said second current-to-voltage converter to the input of said first current-to-voltage converter, said switching means comprising a field effect transistor switch, said second current-to-voltage converter comprising an operational amplifier and a feed-back path connecting the output of said operational amplifier to its input, said feed-back path including a continuously conducting field effect transistor matched in resistance to said field effect transistor switch over the operating temperature range of said uni-polar/bi-polar digital-to-analog converter, said field effect transistor switch and said field effect transistor comprises a dual integrated FET with matched channel characteristics, and control means for selecting uni-polar or bi-polar operation, said control means controlling the conductivity of said field effect transistor switch in accordance with the selection of uni-polar or bi-polar operation.

* * * * *